(12) United States Patent
Ito et al.

(10) Patent No.: US 7,368,145 B2
(45) Date of Patent: May 6, 2008

(54) METHOD AND APPARATUS FOR MANUFACTURING ORGANIC EL DISPLAY AND COLOR FILTER BY INK JET METHOD

(75) Inventors: Nobuyuki Ito, Tokyo-to (JP); Norihito Ito, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/662,718

(22) Filed: Sep. 15, 2003

(65) Prior Publication Data

US 2005/0100660 A1 May 12, 2005

(30) Foreign Application Priority Data

Sep. 19, 2002 (JP) .............................. 2002-273756

(51) Int. Cl.
B05D 5/06 (2006.01)

(52) U.S. Cl. ............... 427/66; 427/256; 427/427.3; 427/595

(58) Field of Classification Search ................ 427/66, 427/68, 256, 427.3, 595; 347/102
See application file for complete search history.

(56) References Cited

U.S. PATENT DOCUMENTS

| | | | |
|---|---|---|---|
| 4,356,429 A | | 10/1982 | Tang |
| 4,811,038 A | * | 3/1989 | Gordon et al. ............. 347/16 |
| 5,606,356 A | * | 2/1997 | Noguchi et al. ............ 347/100 |
| 5,921,836 A | * | 7/1999 | Nanto et al. ................. 445/24 |
| 6,137,221 A | * | 10/2000 | Roitman et al. ............ 313/504 |
| 6,319,469 B1 | * | 11/2001 | Mian et al. ................... 422/64 |
| 6,623,097 B2 | | 9/2003 | Okada et al. |
| 6,720,029 B2 | * | 4/2004 | Fujita et al. ................ 427/157 |
| 6,730,537 B2 | * | 5/2004 | Hutchison et al. ........... 438/99 |
| 6,878,312 B1 | | 4/2005 | Kanbe et al. |
| 2001/0050532 A1 | * | 12/2001 | Eida et al. .................. 313/504 |
| 2002/0127344 A1 | * | 9/2002 | Pham et al. ................ 427/421 |
| 2002/0187272 A1 | * | 12/2002 | Kojima et al. .............. 427/421 |
| 2003/0231234 A1 | * | 12/2003 | Ushirogouchi et al. ..... 347/100 |

FOREIGN PATENT DOCUMENTS

| | | |
|---|---|---|
| JP | 57-51781 | 3/1982 |
| JP | 3-273087 | 12/1991 |
| JP | 11-339957 | 12/1999 |
| JP | 2001-85161 | 3/2001 |
| JP | 2001-341296 | 12/2001 |
| WO | WO 00/59267 | 10/2000 |

* cited by examiner

*Primary Examiner*—Timothy Meeks
*Assistant Examiner*—Jimmy Lin
(74) *Attorney, Agent, or Firm*—Ladas & Parry LLP

(57) ABSTRACT

A method and apparatus for manufacturing an EL layer of uniform thickness, causing effective light emission of pixel openings and manufacturing an organic EL display showing sufficient brightness and excellent in practicability, by an ink jet method. A method and apparatus for manufacturing a color filter excellent in practicability by an ink jet method, in which a dye layer with uniform thickness is formed and optical coloring of uniform tone is conducted at pixel openings. The method includes: a process of discharge-placing at least an organic EL material in the form of solution on a substrate; and a process of drying the organic EL material in the form of ink placed on the substrate by heating, and the organic EL material is dried by heating over thereof.

2 Claims, 9 Drawing Sheets

200: ELECTRODE DISCONNECTION
201: THICK FILM PORTION

FIG. 11

201: THICK FILM PORTION

METHOD AND APPARATUS FOR MANUFACTURING ORGANIC EL DISPLAY AND COLOR FILTER BY INK JET METHOD

BACKGROUND OF THE INVENTION

1. Field of the Invention

The present invention relates to an information display. Particularly, the present invention relates to a method and apparatus for manufacturing an organic electroluminescence (EL) display. Further, the present invention relates to a method and apparatus for manufacturing a color filter.

2. Description of the Related Art

Recently, flat displays are used in many fields and places, and the importance is growing with the progressing of computerization. Nowadays, the typical examples of flat displays are liquid crystal displays (LCD), however, as flat displays based on a different display mode from that of LCD, organic EL, inorganic EL, plasma display panels (PDP), light emitting diode displays (LED), vacuum fluorescent displays (VFD), field emission displays (FED), and the like are being actively developed. These new flat displays are all called a display of self light emitting type, and are significantly different from LCD in the following points and have excellent features not observed in LCD.

LCD is called a light receiving type in which a liquid crystal itself does not emit light and acts as so-called shutter allowing permeation and shutoff of outer light, constituting a display. Therefore, it needs a light source, and in general, a back light is necessary. In contrast, that of light emitting type does not require a separate light source since the apparatus itself emits light. In those of light receiving type such a LCD, a back light is constantly on, irrespective of the form of displaying information, and electric power approximately the same as that under the entire display condition is consumed. In contrast, that of self light emitting type has a theoretical merit that consumption of electric power is smaller as compared with a display of a light receiving type since only portions required to be on depending on display information consume electric power.

Likewise, in LCD, since dark condition is obtained by shading light of a back light source, it is difficult to inhibit light leakage completely, even in small quantity, while in a display of self light emitting type, no light emitting condition is directly dark condition, therefore, theoretical dark condition can be obtained easily, and a display of self light emitting type is overwhelmingly excels also in terms of the contrast.

Since LCD utilizes polarization control by double refraction of liquid crystal, there is so-called strong visibility angle dependency, which display condition varies significantly depending on observing direction, while in the case of a display of self light emitting type, this problem scarcely happens.

Further, since LCD utilizes alignment change derived from the dielectric anisotropy of liquid crystal which is an organic elastic substance, the response time against electric signals is theoretically 1 ms or more. In contrast, in the above mentioned technologies being developed, so-called carrier transition such as electron/hole, electron discharge, plasma discharge and the like are utilized. Consequently, the response time is in "ns" order, and incomparably faster than that of liquid crystal, causing no problem of remaining of animation derived from slowness of the response of LCD.

Among them, study of organic EL is particularly active. Organic EL is also referred to as OEL (Organic EL) or organic light emitting diode (OLED: Organic Light Emitting Diode).

An OEL element and OLED element have a structure in which a layer (EL layer) containing an organic compound is sandwiched in between a pair of electrodes of an anode and a cathode, and a lamination structure of "anode electrode/hole injection layer/light emitting layer/cathode electrode" such as of Tang etc. is a basic structure (see Japanese Patent No. 1526026).

While a low molecular weight material such as Tangs etc. is used, Nakano et al. use a high molecular weight material (see Japanese Patent Application Laid-Open (JP-A) No. 3-273087).

Further, improvement in efficiency using a hole injection layer or electron injection layer, or control of light emitting color by doping a fluorescent dye and the like to a light emitting layer, are also conducted.

As the method for manufacturing a display using organic EL, formation of a light emitting layer by discharging a light emitting material using an ink jet discharging apparatus is known (for example, see JP-A No. 11-339957, International Publication No. 00/59267 pamphlet, JP-A No. 2001-85161 and JP-A No. 2001-341296).

In the JP-A No. 11-339957, as solution of a light emitting material, a substrate is heat-dried or vacuum-heat-dried after removal of a solvent at room temperature after discharging onto a substrate, however, after a solvent is removed to a certain degree, no effect of making film thickness even by forcible drying is obtained.

Furthermore, there are already several trials to forcibly evaporate and dry a solvent, in making a light emitting layer in ink solution condition into a film in a similar method for manufacturing an organic EL display by an ink jet method, and for example, in the International Publication No. 00/59267 pamphlet, a light emitting material which has been made into ink using a solvent having high boiling point is fed and distributed on a substrate, then, the substrate is heat treated. This procedure is performed to obtain an effect of drying a substrate by heating, even after formation of a light emitting layer on the entire surface of a substrate, by using a solvent of high boiling point to slow the evaporation speed of the solvent and to elongate air drying time. However, removing of a solvent of high boiling point completely cannot avoid a problem that heating treatment at higher temperature is necessary, leading to deterioration of a light emitting material. Though deterioration is not observed in the initial light emitting property, this problem exerts a large influence particularly on shortening of light emitting life. If heating treatment is not conducted at sufficient high temperature, a problem of heat deterioration of a light emitting layer will not occur, however, its leads to significant deterioration of the reliability of a light emitting layer due to the remaining of a solvent in a light emitting layer formed as a film.

In the JP-A No. 2001-85161, heating treatment is conducted at higher temperature than the softening point of a material of a light emitting layer, to form a light emitting layer, and there is a problem of deterioration of a light emitting material as described above.

Further, in JP-A No. 2001-341296, vapor of solvent which is evaporated from the discharged liquid droplets are compulsively removed from the substrate surface by blowing a gas from a certain angle of the substrate. This prevents other pixels from being influenced due to the solution vapor remaining within the substrate surface, particularly prevents difference of drying condition between each pixel due to pixels already discharged being touched by the solvent evaporated from the newly discharged pixels. However, this only blows the dried solvent vapor, and the drying is not compulsive. This may have an effect of improving drying uniformity within the substrate surface, but there is no description about improving the uniformity of stereoscopic film thickness within a pixel, further, they are even not aware of a problem on this case.

Figure 7:
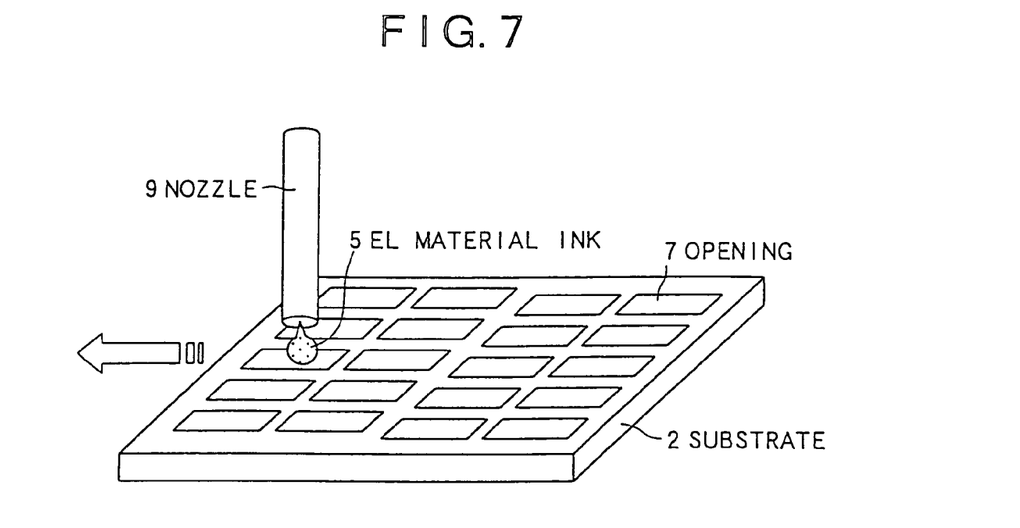
FIG. 7 is a constitutional view showing a method for forming an organic EL display by an ink jet method.
Figure 9:
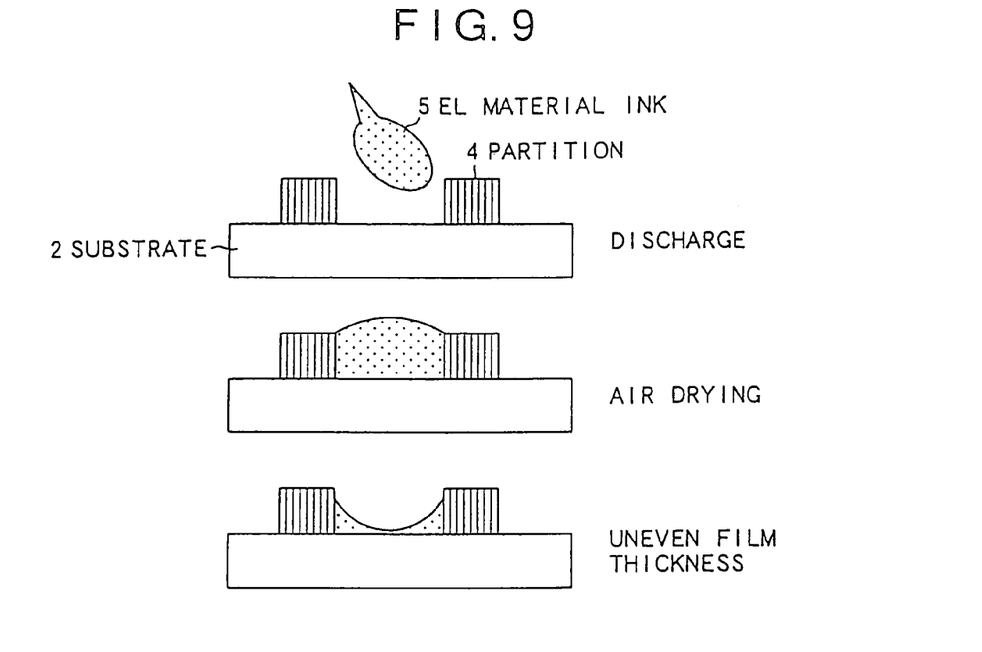
FIG. 9 is a view showing the condition of an organic EL layer by an ink jet method when flattening is not performed.
Figure 10:
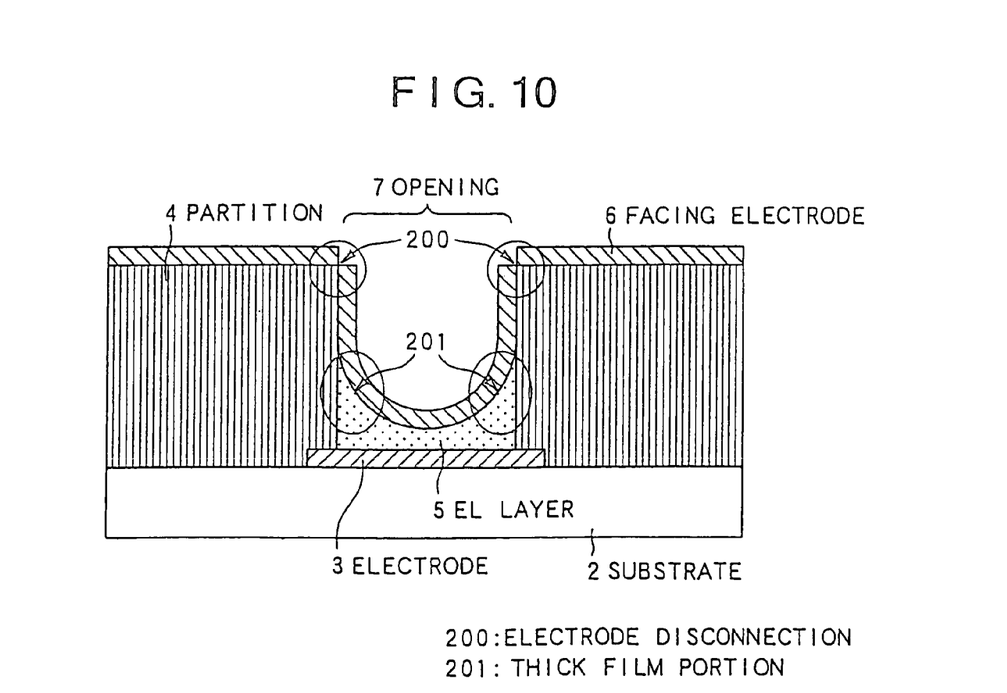
FIG. 10 is a sectional constitutional view of a display manufactured by conventional manufacturing methods.

The method for manufacturing an organic EL display by an ink jet method will be described. As shown in FIG. 7, an EL material ink in the form of solution is precisely discharged to predetermined openings on a substrate by a finely processed nozzle. In FIG. 7, the surface of the substrate is drawn as flat surface. However, actually as shown in FIG. 10, there are partitions having a height of about 5 μm is formed on a substrate to retain the discharged ink. When the solution is discharged to inside of such fine partitions, formation of so-called meniscus surface condition, by the surface tension of liquid, cannot be avoided. When an EL material ink is dried by evaporation of a solvent under this meniscus surface condition, the meniscus surface condition as ink state is reflected as it is, and the thickness of an EL layer becomes uneven as shown in FIGS. 9 and 10. When electric field is applied to such an EL layer having uneven thickness, electric current concentrates on a smaller thickness portion, and in contrast, electric current does not flow sufficiently to a thick film portion 201, consequently, causing a difference in light emitting brightness.

Figure 12:
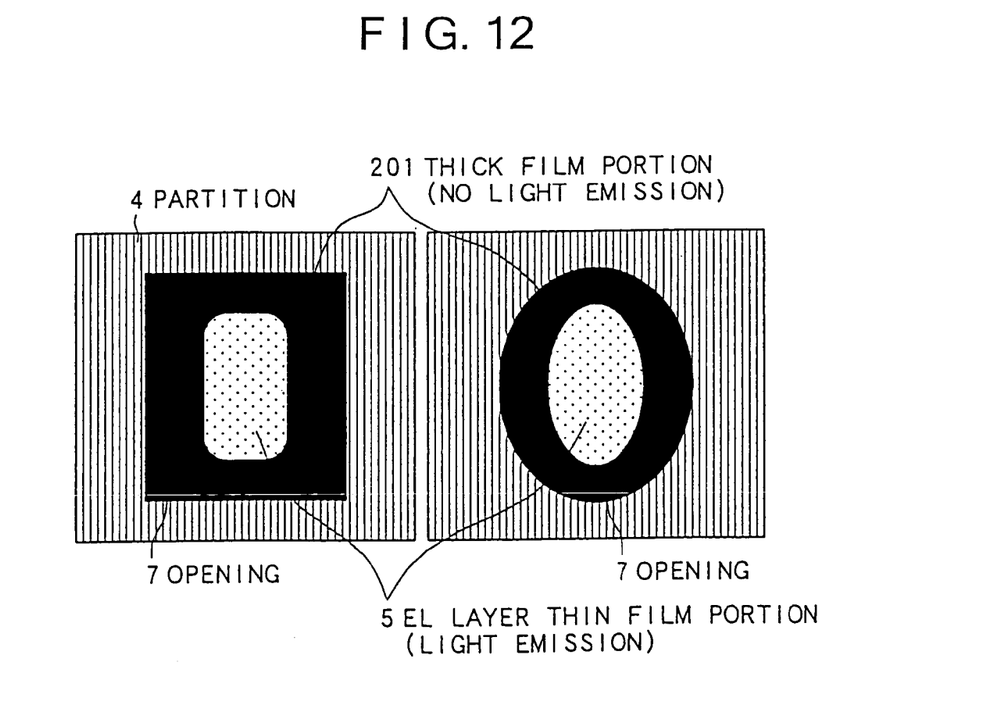
FIG. 12 is a view showing the displaying condition of a display manufactured by conventional manufacturing methods.

Actually, when electric field is applied to an EL layer having uneven thickness as shown in FIG. 10, a phenomenon occurs in which only the center portion of pixels having smaller thickness emits light, as shown in the FIG. 12. FIG. 12 shows a pixel opening in the form of rectangle and a pixel opening in the elliptic form. When only the pixel center portion emits light as described above, brightness and efficiency sufficient as a display cannot be attained.

Otherwise, a problem of disconnection of facing electrodes is also important. Usually, since a facing electrode is formed by vapor depositing a metal thin film, thickness from 100 nm to at most 500 nm is a limitation for stable formation. When thicker than this, a risk of peeling increases due to the tension of a metal itself since it is no longer a thin film. With thickness in this range, when a partition has a height of 5 μm or more, disconnection tends to occur at a corner part of a partition illustrated as 200, as shown in FIG. 10, and a lot of defective pixels occur which electric field is not applied to an EL layer.

Figure 11:
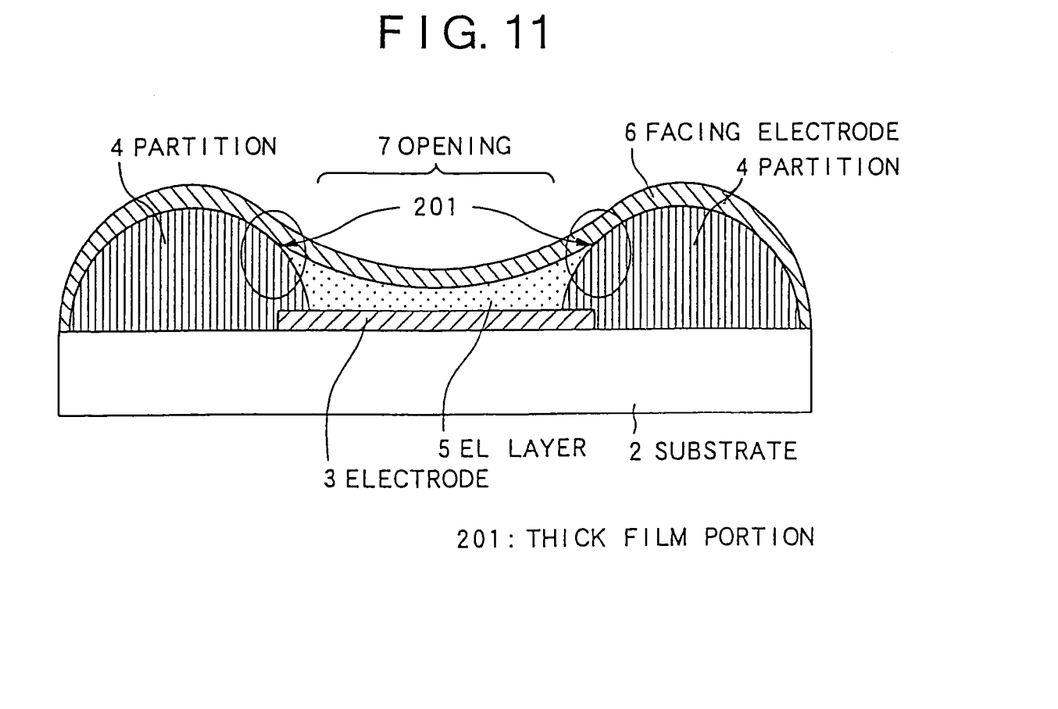
FIG. 11 is a sectional constitutional view of another conventional display manufactured and improved by conventional manufacturing methods.

By smoothening the form of a partition as shown in FIG. 11, a problem of disconnection can be solved. However, a problem of uneven thickness of an EL layer caused by a meniscus phenomenon is not solved. The problem of uneven thickness due to a meniscus phenomenon occurs not only in an EL light emitting layer but also in other functional layers, for example, a hole injection layer, hole transportation layer, electron injection layer and electron transportation layer when formed from a solution.

Figure 17:
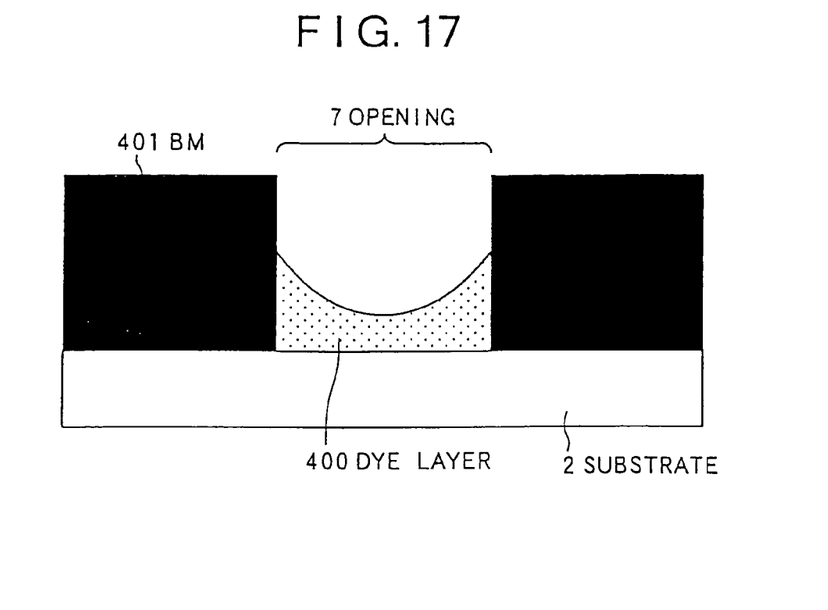
FIG. 17 is a sectional view of a color filter manufactured by a conventional ink jet method.

On the other hand, regarding also organic EL displays of a mode which uses color filters, or displays using a color filter such as LCD and the like described later, an ink jet method still attracts attention as a promising method for reducing the manufacturing cost of a color filter and enhancing competitiveness. In manufacturing by an ink jet method, color filters are formed by discharging a dye 400 in the form of solution also through a nozzle, using a black matrix (BM) 401 as a partition as shown in FIG. 17. In comparison with a conventional lithography method, there is a merit of significant improvement in efficiency of utilization of a dye material. However, as shown in FIG. 17, there is a problem that flattening of a dye layer is difficult, same as in the case of an organic EL material described above. In the case of a color filter, tone changes depending on the thickness of a dye layer. Therefore, when the film thickness is still uneven as shown in FIG. 17, it will be a color filter having irregularity and useless.

SUMMARY OF THE INVENTION

The present application has been accomplished in view of the above mentioned point, and the object is to provide a method and apparatus in which an uniform thickness EL layer is formed, a pixel opening emits light effectively, and an organic EL display having sufficient brightness and excellent in practice is manufactured by an ink jet method. The further object thereof is to provide a method and apparatus for manufacturing a color filter excellent in practice, by an ink jet method, in which an uniform thickness dye layer is formed and optical colorization of uniform color tone is conducted at a pixel opening.

The present invention is a method for manufacturing an organic EL display by an ink jet method, wherein an uniform organic EL layer is formed by sequentially continuously carrying out: a process of discharge-placing an organic EL material in the form of solution on a substrate; and a process of drying the organic EL material in the form of ink placed on the substrate by heating, and also a method for manufacturing where in the organic EL material is dried by heating over thereof. Further, the present invention is a method for manufacturing an organic EL display wherein the placing of the organic EL material on the substrate and drying by heating are sequentially continuously carried out by relatively moving the substrate to a nozzle which discharges the organic EL material and to a heating device which heats the organic EL material over thereof. By these methods for manufacturing, a problem of uneven thickness of the EL layer can be solved.

When an organic EL display or a color filter is manufactured by an ink jet method, by employing the present invention, flattening of an organic EL layer and a color filter coloring layer can be easily achieved, and an organic EL display and a color filter with high material usability and excellent property uniformity can be provided.

DESCRIPTION OF THE PREFERRED EMBODIMENTS

Embodiments of the present invention will be illustrated in detail referring to drawings.

First, the effect of the present invention will be described referring to FIGS. 8 and 9. FIG. 9 is a view showing a film formation process of an organic EL material by a conventional ink jet method and the condition of the formed organic EL layer. An organic EL material in the form of ink discharged by an ink jet method into a space, formed by partitions on a substrate, is formed into a convex shape to the substrate surface due to the surface tension in the same manner as usual liquid when reaches to a substrate. If the above mentioned is air-dried as it is, a solvent is gradually evaporated to cause so-called meniscus shape, giving uneven layer thickness. Particularly, in the case of a pixel of a display, the diameter of an opening is usually is very small as about 10 μm in terms of circle, and in order to fit into this size, a liquid drop is also vary small.

Thus, under small size liquid drop condition, the surface area is by far larger as compared with the volume of an ink, therefore, drying by evaporation from the surface is dominant as compared with evaporation from inside of a liquid drop of a solvent, and a change of the form of the film upper surface (here, lowering of liquid surface) occurs. In addition, because of the surface tension of a partition, a meniscus shape is formed and the film thickness becomes uneven.

Figure 8:
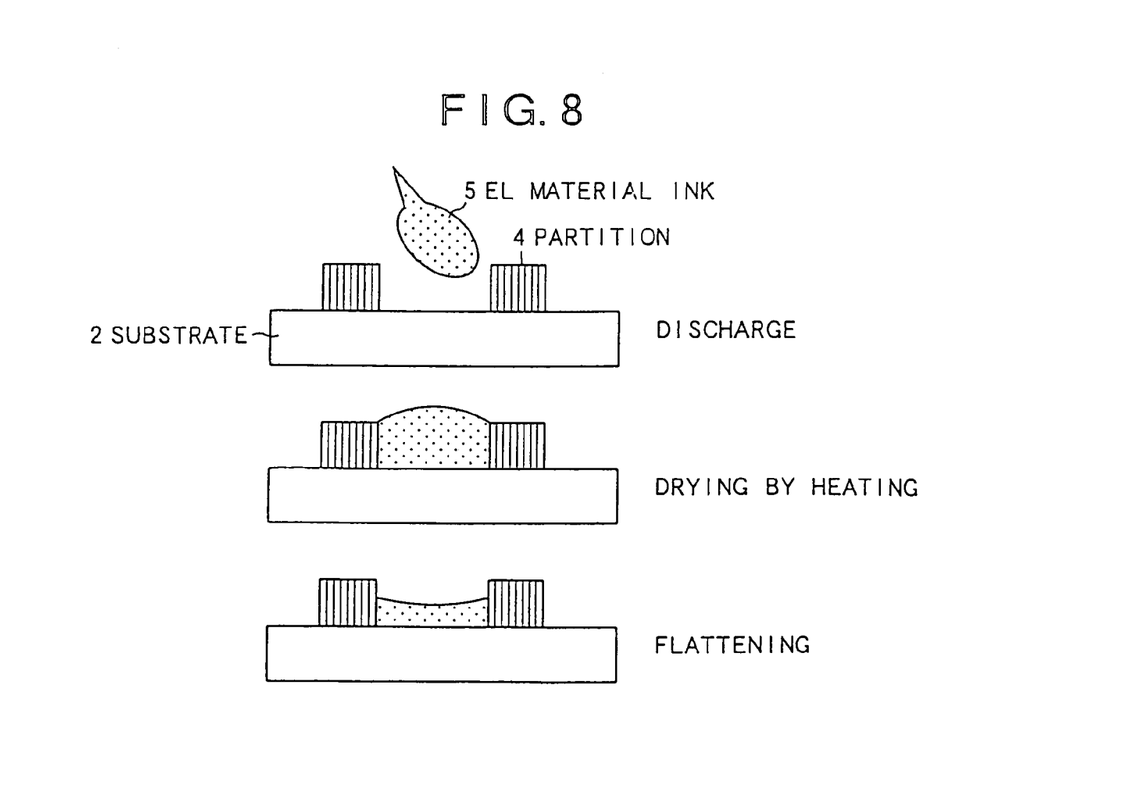
FIG. 8 is a process view showing a process of flattening an organic EL layer by an ink jet method.

FIG. 8 is a view showing the case of forcible drying by heating immediately after the discharge of an ink, and the inventors have found that when such forcible drying is conducted, the meniscus shape of the film surface is lightened and the film thickness becomes even. In view of the above mentioned solvent drying condition, it is believed that by conducting forcible heating, the liquid drop is heated entirely, and a solvent inside the liquid drop is forcibly evaporated, leading to a difficulty in generation of a change in the form of the film upper surface.

Further, an effect of flattening of film shape by such forcible drying is required to be performed as soon as possible after the discharge, and it is effective to drying by heating immediately after discharge, at most within 60 seconds. Once uneven film thickness is formed by air drying, film shape does not change even by forcible drying.

As the manufacturing apparatus for realizing the above mentioned manufacturing method precisely on a substrate having plural fine pixel openings, an apparatus for manufacturing an organic EL display comprising a device for drying a solution material on a substrate by heating over thereof on an axis of relative moving direction of a nozzle and the substrate, wherein after a process of discharging an organic EL material from the nozzle thereby placing at a predetermined position on the substrate, a process of drying the organic EL material by heating is carried out at the backward of the nozzle while relatively moving the nozzle and the substrate, and further, an apparatus for manufacturing an organic EL display comprising the device for drying the solution material on the substrate by heating over thereof, on the both side of the nozzle, on an axis of relative moving direction of the nozzle and the substrate, wherein after a process of discharging an organic EL material from the nozzle thereby placing at plural pixel openings placed in the form of two-dimensional matrix on the substrate by relative parallel reciprocation of the nozzle and the substrate, a process of drying the organic EL material by heating is always carried out by the heating device at the backward of the nozzle accompanied with a change of relatively moving direction of the nozzle and the substrate, were produced. As a device for drying the solution material on the substrate by heating over thereof, an infrared heater was used.

The present invention will be illustrated more in detail with explanation of these manufacturing apparatuses.

Figure 1:
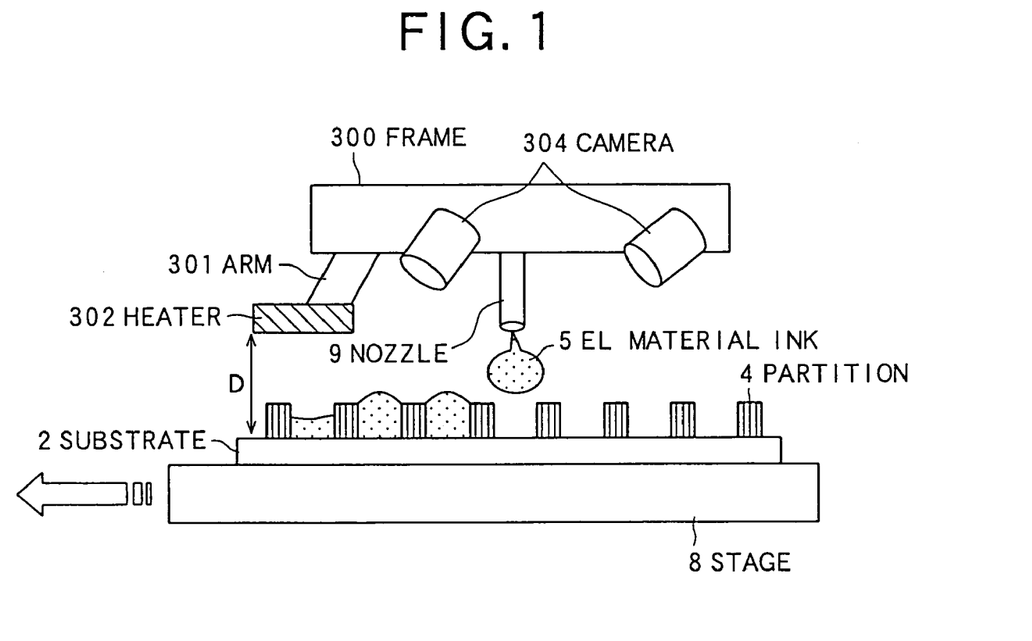
FIG. 1 is a sectional constitutional view of a method and apparatus for manufacturing a display according to a first example of the present invention.

The manufacturing apparatus of precisely realizing the method for manufacturing an organic EL display of the present invention, on a substrate having plural fine pixel openings, has a basic structure shown in FIG. 1. It comprises a heater 302 which is a device for drying a solution material on a substrate by heating over thereof on an axis of relative moving direction of a nozzle 9 and the substrate 2. They are incorporated to a frame 300 by an arm 301. Also a camera 304 is provided for observing the discharging condition and drying condition of an EL material ink 5.

The manufacturing apparatus of the present invention comprises these head portion, a stage 8 supporting the substrate having a partition 4 as described above in the explanation of an ink jet method, and a device for moving them.

In FIG. 1, the ink is discharged form the nozzle while moving the stage to the direction shown by an arrow. By the heater placed at the backward of the nozzle in the relative moving direction of the nozzle and the stage, the ink placed on the pixel is forcibly dried by heating. As shown in FIG. 1, by incorporating the nozzle and the heater, an organic EL layer having uniform film thickness and having remarkably improved flatness as compared with conventional layers can be formed by sufficient forcible drying by heating in a short time until air drying. By discharging and drying by heating one after another to a lot of pixels, manufacturing with good precision and with high through put is possible even in the case of a large size substrate and a lot of pixels of high precision. In the ink jet method, the distance between an object and a nozzle is a very important condition, as well as in the drying by heating, together with the temperature of the heater, a distance "D" between the heater and the substrate is important to obtain sufficient effect. Therefore, a precise stretching mechanism is provided to the arm so that the distance will be independently adjustable. The relative speed of the head portion and the stage is another important apparatus condition. However, in fact, these conditions are set to the most preferable condition according to the velocity and the like of the solvent and the ink material which will be used. In order to dry the ink effectively and non-contactly by heating, for the heater to be used, an infrared heater (IR heater) is effective.

Naturally, the same effects can be obtained, not only for the organic EL light emitting layer, but also for other functional layers such as a hole injection layer, hole transportation layer, electron injection layer and electron transportation layer, when they are formed with solutions.

By stage heating, which is the most common forcible drying by heating, it is extremely difficult to obtain the same effects as the present invention. When the stage is previously heated to a predetermined temperature, the nozzles are heated by the heat so that the concentration of the solution will be changed due to the evaporation of the solvent, causing not only a drastic deviation of the ink discharging condition, but also clogging of the nozzles leading to many poor discharges. In general, in order to control the discharge, flight direction, and point of impact of the ink precisely by ink jet method, the distance of the nozzle and an object has to be set to an extremely short distance such as 1 mm or less, or a few hundred μm. Therefore, it is inevitable for the nozzles to be heated by stage heating, leading to the poor discharges.

Figure 2:
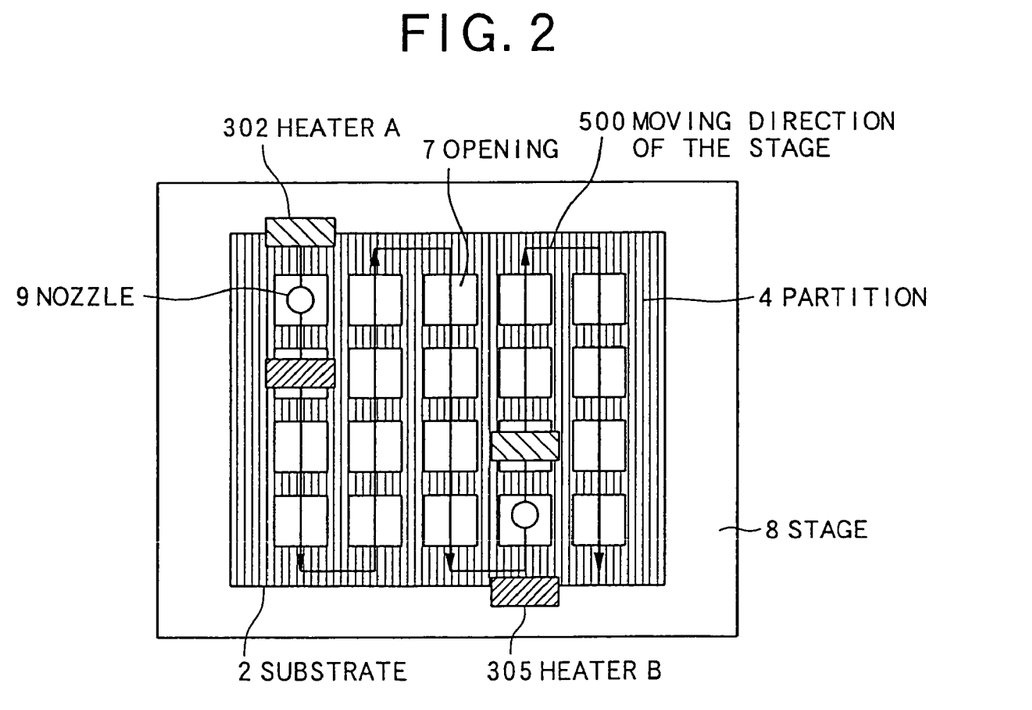
FIG. 2 is a front view of a method and apparatus for manufacturing a display according to a second example of the present invention.
Figure 3A:
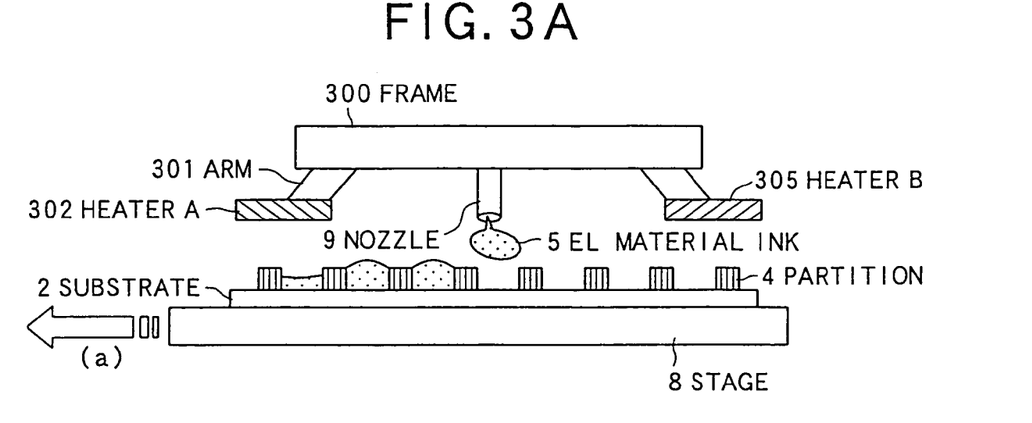
FIG. 3 is a sectional view of a method and apparatus for manufacturing a display according to a second example of the present invention.
Figure 3B:
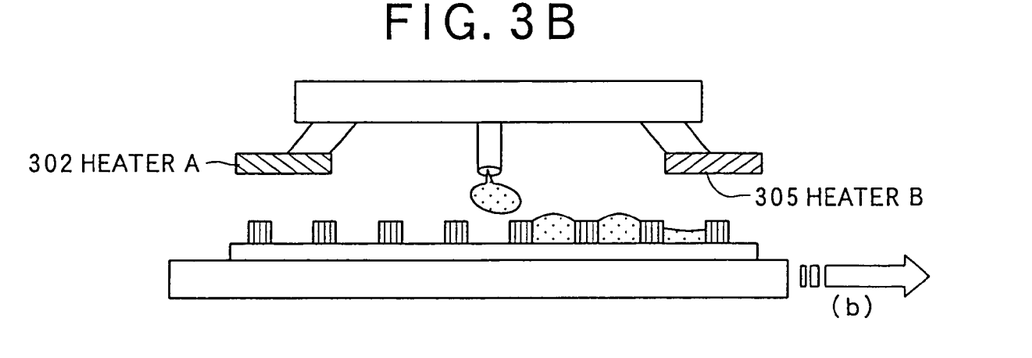

More practical manufacturing apparatus which carry out processing continuously to plural pixels placed in a matrix form on a substrate is shown in FIGS. 2 and 3.

As shown in FIGS. 2 and 3, the present manufacturing apparatus comprises heaters on the both sides of the nozzle, heater A and heater B, on the axis of relative moving direction of the nozzle and the substrate. The head portion and the nozzle portion carry out the above mentioned ink discharge and drying by heating continuously while they reciprocate in parallel 500 as shown in FIG. 2. At that time, positional relationship of the nozzle, discharged ink and heater shown in FIG. 1 changes from time to time in compliance with the reciprocation. In FIGS. 2 and 3, the heater A and heater B are selectively operated according to the moving direction, and as shown in FIG. 3, drying of the ink just after discharge by heating can be carried out effectively in spite of the moving direction.

The shape and size of the heater for heating in FIG. 2 is drawn so that a heater corresponds to one pixel and one nozzle. However, as in FIG. 2, it is not practical to discharge to the all pixels with one nozzle in terms of the treatment speed and manufacturing time. In fact, ink is discharged to plural rows of pixels at a same time with plural nozzles. Therefore, actual heater for heating is in a corresponding size. However, when ink is discharged at a same time with plural nozzles, not so many nozzles can be provided in some cases. In that case, an area which is treated at one time is small so that stage portion where there is nothing to do with ink drying will be heated if a heater cannot be processed to a small size. As mentioned above, it is not preferable for the stage temperature to be raised. In that case, it is preferable to provide a temperature adjusting mechanism, which mainly cools, so as the stage temperature will not be raised. As a temperature adjusting mechanism, a chiller, a Peltier or a combination thereof, in which cooling water or cooling oil is circulated within grooves provided on the stage, can be used.

Figure 4:
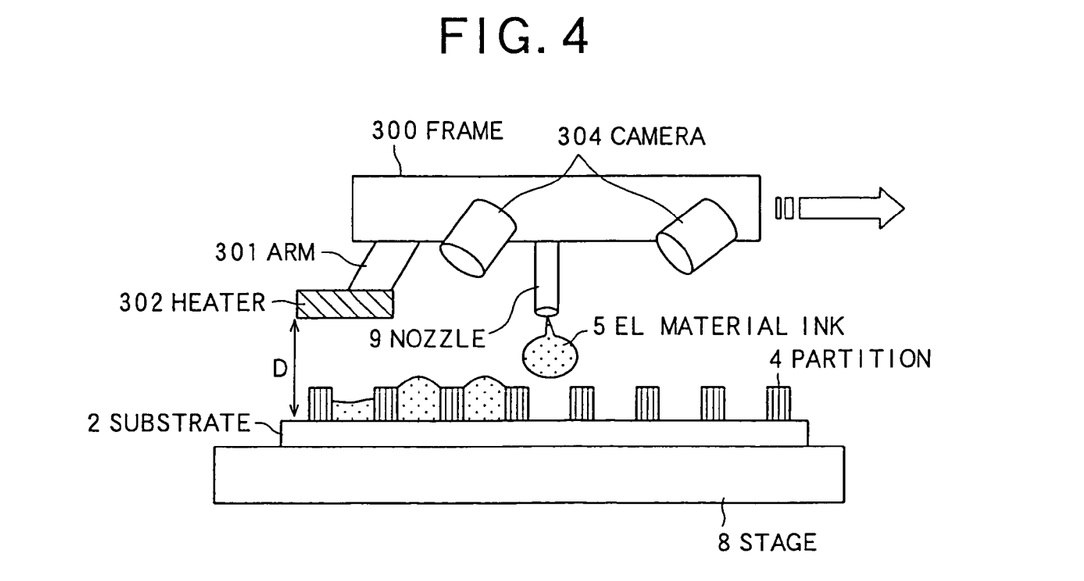
FIG. 4 is a sectional view of a method and apparatus for manufacturing a display according to a third example of the present invention.
Figure 5:
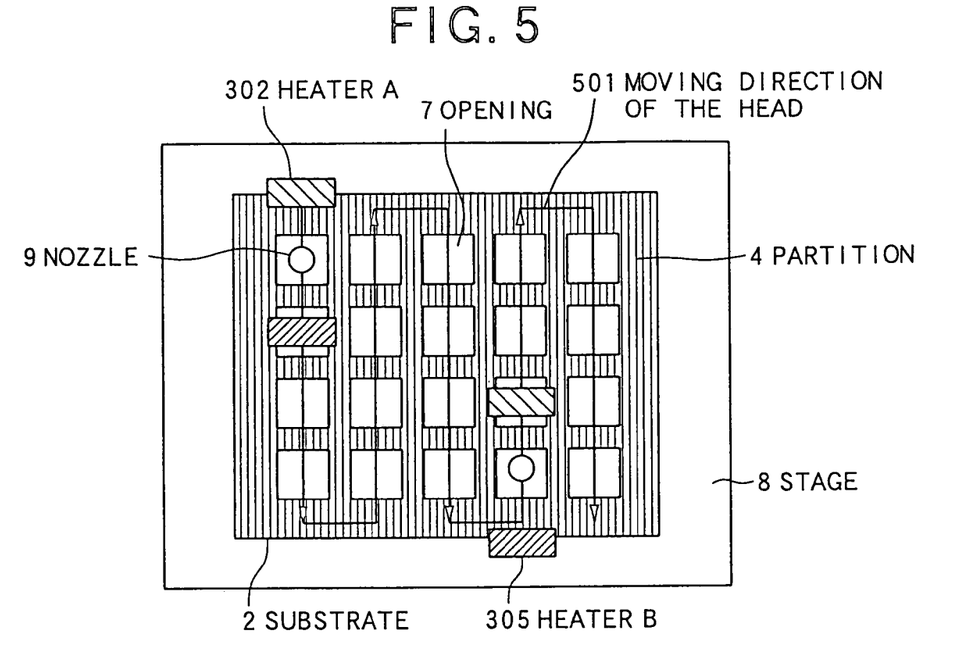
FIG. 5 is a front view of a method and apparatus for manufacturing a display according to a fourth example of the present invention.
Figure 6A:
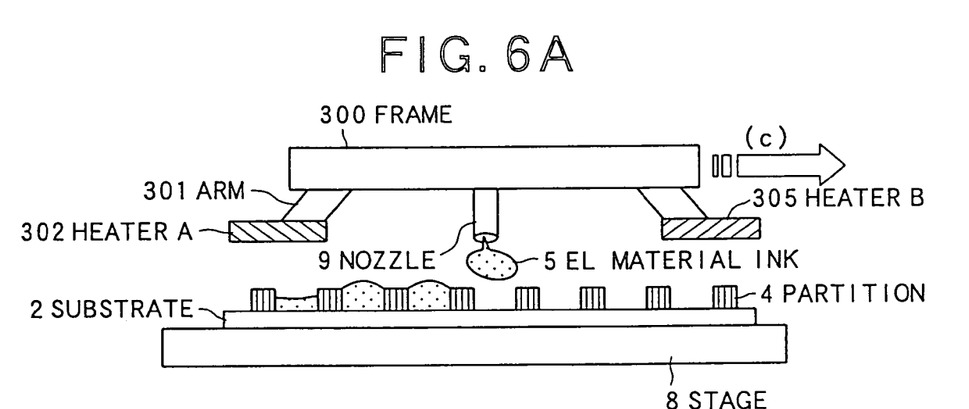
FIG. 6 is a sectional view of a method and apparatus for manufacturing a display according to a fourth example of the present invention.
Figure 6B:
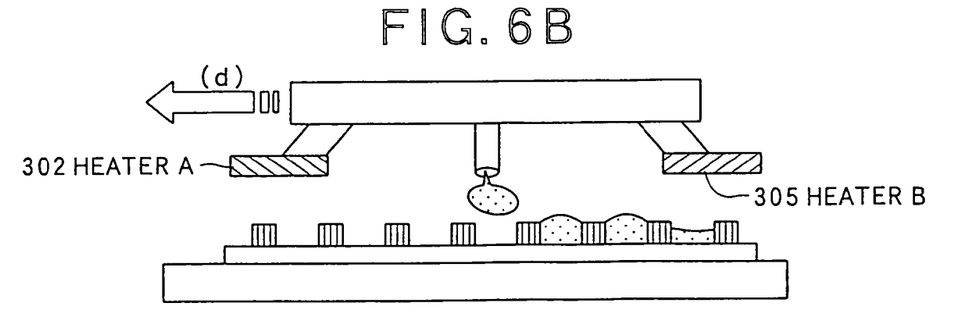

FIGS. 1, 2 and 3, show cases where the head is fixed and the stage is moved while FIGS. 4, 5 and 6 show cases where the stage is fixed and the head is moved, corresponding to the above figures. Naturally, both the head and stage can be moved.

In this specification, a pixel electrode and facing electrode correspond to either an anode or cathode so as to constitute a pair of electrodes. All layers provided in between them are generically called EL layers, and hole injection layer, hole transportation layer, light emitting layer, electron injection layer and electron transportation layer are included in this.

Figure 13:
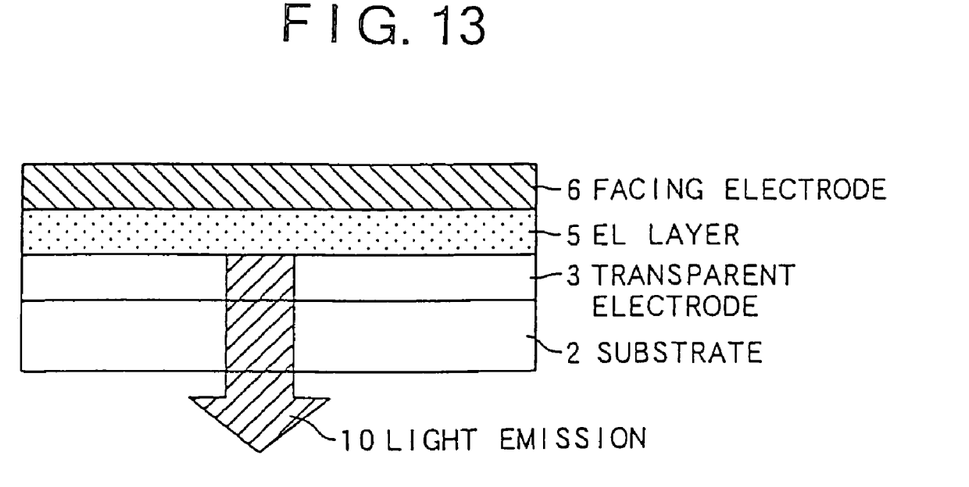
FIG. 13 is a sectional constitutional view of an organic EL element.

FIG. 13 shows the sectional structure of an organic EL element.

Organic EL emits light when electric field is applied to electrodes and electric current is passed through an EL layer. Conventionally, only fluorescent emission due to returning from singlet excited state to ground state was used, however, as results of recent studies, phosphorescence emission due to returning from triplet excited state to ground state can be utilized effectively and efficiency is improved.

Usually, a translucent electrode 3 is formed on a translucent substrate 2 such as a glass substrate and plastic substrate, then, an EL layer 5 and a facing electrode 6 are formed in this order. In general, an anode is constituted of a translucent electrode such as ITO and the like, and a cathode is a non-translucent electrode constituted of a metal, in many cases.

Though not shown in FIG. 13, since an organic EL element shows remarkable deterioration in properties by moisture and oxygen, in general, reliability thereof is insured by filling an inert gas so that an element does not contact to moisture and oxygen, then, using another substrate, or conducting so-called sealing by vapor deposition of a thin film.

When an organic EL element is used as a display, the mode can be roughly classified into a passive matrix mode and active matrix mode depending on the electrode constitution and driving method, as for LCD. In the passive matrix mode, a pair of electrodes is constituted of a horizontal electrode and vertical electrode mutually crossing while sandwiching an EL layer so that its structure is simple. However, for displaying an image, moment brightness has to be enhanced by the multiple of the number of scanning lines by time divisional scanning, and in displays of usual VGA or more, moment brightness of organic EL of over 10000 $cd/m^2$ is necessary, causing a lot of practical problems as a display. In the active matrix mode, a pixel electrode is formed on a substrate on which TFT or the like is formed, and an EL layer and facing electrode are formed, namely, its structure is complicated as compared with the passive matrix method, however, it is advantageous as an organic EL display in many points such as light emitting brightness, consumption power and crosstalk.

Further, a display of active matrix mode, using a polycrystalline silicon (polysilicon) film or a continuous grain boundary silicone (CG silicon) film, manifests higher electric charge mobility than an amorphous silicon film, therefore, it can treat TFT with large electric current and is suitable for driving of organic EL which is a current driven element. Since polysilicon TFT and CG silicon TFT can move at high speed, various control circuits, conventionally treated by exterior IC, are formed on the same substrate as for a display pixel, and there are a lot of merits such as reduction of the size, lowering the cost, multi-functioning and the like of a display.

Figure 15:
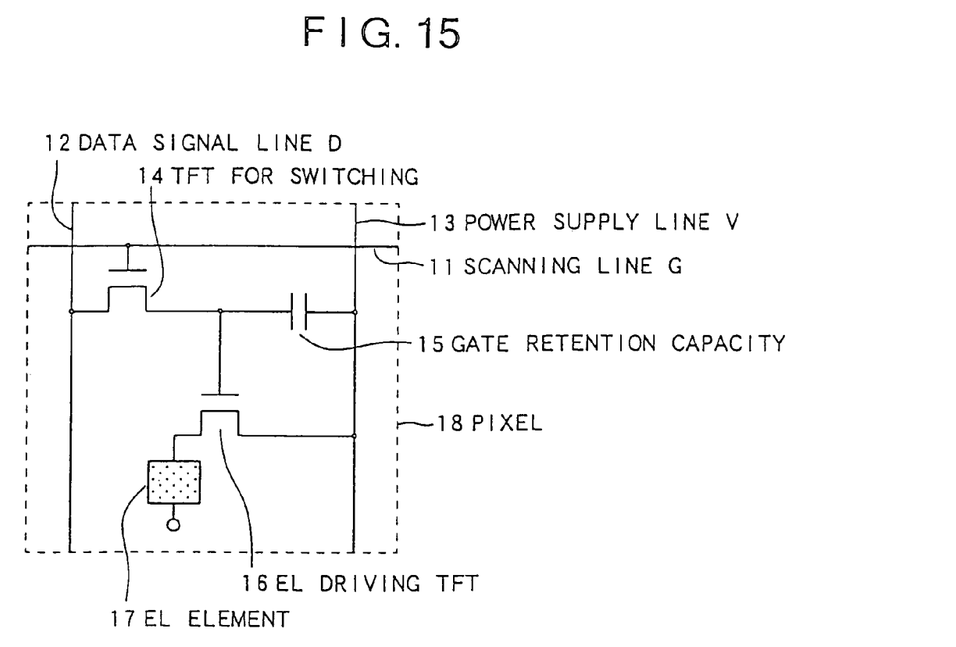
FIG. 15 is a circuit diagram showing the constitution of a pixel of an active driving organic EL display.
Figure 16:
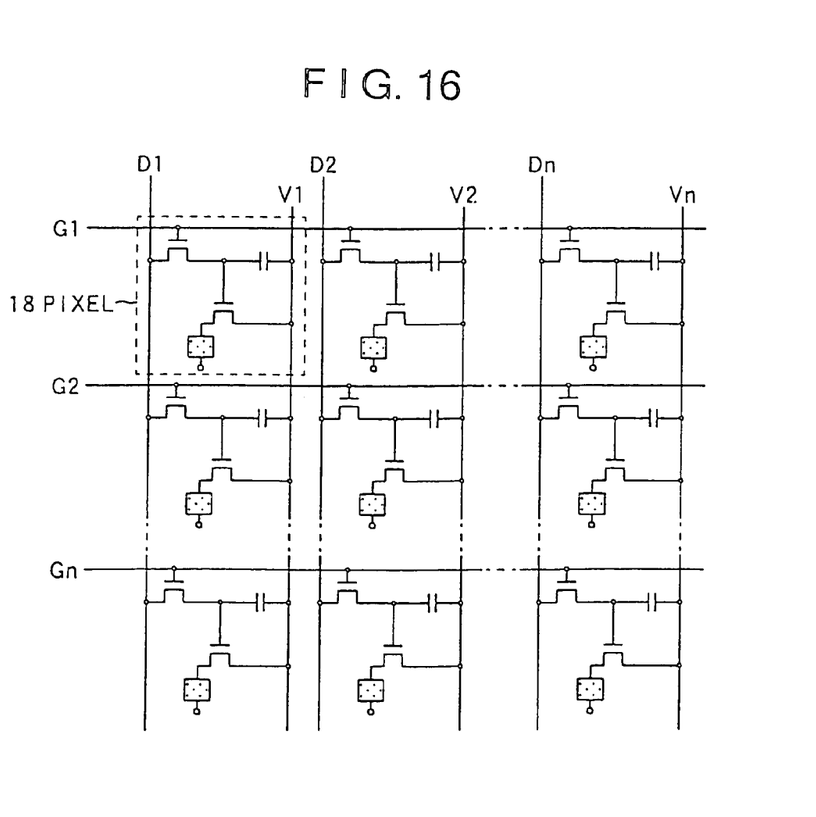
FIG. 16 is a constitutional view showing the constitution of a matrix pixel of an active driving organic EL display.

FIG. 15 shows a typical pixel circuit constitution of an active matrix organic EL display. In addition to bus lines such as a scanning line G11, data signal line D12 and power supply line V13, the apparatus comprises switching TFT14, gate retention capacity 15, driving TFT16 and EL element 17. When a gate of switching TFT, selected by the scanning line G, is opened and signal voltage corresponding to emitting strength is applied from the date signal line D to a TFT source, a gate of driving TFT is opened in analogue-wise responding to magnitude of signal voltage, and this condition is retained in gate retention capacity. When voltage is applied from the power supply line V to a source of driving TFT, electric current corresponding to the degree of opening of a gate flows into an EL element, to cause light emission in gradation depending on the magnitude of signal voltage. FIG. 16 shows the structure of an actual display in which pixels 18 are placed in a form of matrix.

The circuit constitution and driving method of an organic EL display include, as other examples, a method in which the number of TFT is further increased, "Pixel-Driving Methods for Large-Sized Poly-Si AM-OLED Displays" Asia Display/IDW'01 P. 1395-1398 by Yumoto et al., and digital gradation driving methods such as time divisional gradation (sub-field method) by Mizukami et al. "6-bit Digital VGAOLED" SID'00 P. 912-915, area divisional gradation (sub-pixel method) by Miyashita et al. "Full Color Displays Fabricated by Ink-Jet Printing" Asia Display/IDW'01 P. 1399-1402 and the like, any of these technologies may be used.

Even under passive matrix mode, a simple display having a small number of scanning lines can realize a practical apparatus utilizing the simplicity of the structure. Further, development of a phosphorescent emitting material is being progressed in addition to conventional fluorescent emitting materials, and emitting efficiency is improved significantly. By utilizing these light emitting materials having high light emitting efficiency, there is a possibility of solving the conventional problem in the passive matrix mode.

Figure 14:
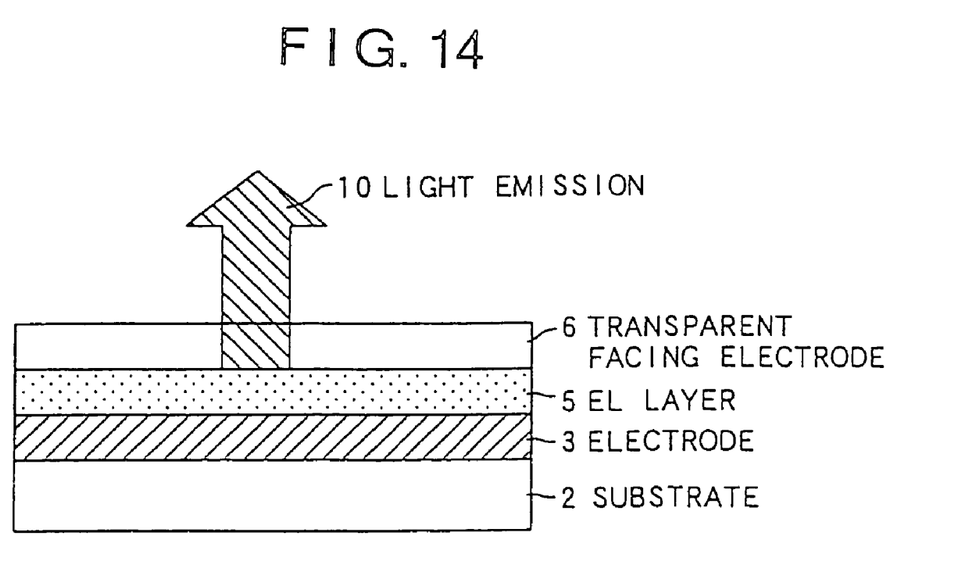
FIG. 14 is another sectional constitutional view of an organic EL element.

Also a top emission structure, in which light emission 10 is taken out toward the opposite direction of a substrate as shown in FIG. 14, is under investigation. In contrast to the top emission structure, a structure shown in FIG. 13 is called a bottom emission structure in some cases. In the top emission structure, particularly in a display of active matrix mode, the light emitting area rate is not limited by circuit constitutions such as TFT and bus lines, so that higher multi-functional and complicated circuits can be formed. Therefore, they are being developed as a promising technology.

In the present invention, any of the above mentioned technologies may be used in organic EL.

The method of attaining colorization includes a CF mode in which a white light emitting layer and color filters (CF) of three colors R, G and B are combined, and a CCM (Color Changing Medium) mode in which a blue light emitting layer and an R and G fluorescent converting dye filter are combined, in addition to a three color juxtaposition mode in which organic EL materials of the most basic three colors R, G and B are precisely placed per each pixel of a display.

When colorization modes are compared, in the CF method, a white light emitting material is necessary, and an apparent white organic EL material for illumination use is realized. However, a real white organic EL material having spectra of three colors R, G and B is not realized yet, and there is a shortcoming that the utilizing efficiency of light emission will become one-third, due to the use of color filters.

In the CCM mode, only a blue emitting material is used, therefore, its light emitting efficiency and R-G converting efficiency of a CCM filter are important. However, sufficient efficiency cannot be obtained easily, and is not practical yet.

The CF mode is insufficient in the point of color reproduction, in the same way that LCD of the CF mode has drawbacks in reproducing TV images. The CCM mode is also one kind of filter mode, and is common in the above respect, and the three color juxtaposition mode is excellent in color reproduction in that composition of each color light emitting material is slightly adjusted. Since the CF mode and CCM mode have shortcomings such as increase in the thickness of an element due to the use of filters, increase in the number of parts, and the like, thus the three color juxtaposition mode is favorable overall.

As the mode of forming three color juxtaposition fine pixels, a mask vacuum vapor deposition method is used in the case of a low molecular weight material, and in the case of a high molecular weigh material, it is made into a solution and an ink jet method, printing method, transferring method and the like are used. Recently, a low molecular weight material which can be coated is also being developed.

In the case of a three color juxtaposition color display, the mask vacuum vapor deposition method of a low molecular weight material has a problem that it is difficult to respond to a large scale display and to produce a large number of displays using a large sized substrate, due to restriction of a vacuum apparatus and a vapor deposition mask. This means that there is no problem in manufacturing of trial manufacturing level in the development, however, requests of the market cannot be responded in terms of tact and cost in the full manufacturing stage.

On the other hand, high molecular weight materials and low molecular weight materials which can be coated can be formed into a film by wet processes such as an ink jet method, printing method, casting method, layer-by-layer self-assembling method, spin coating method, dipping method and the like. Therefore, the above mentioned problems for responding to a large scale substrate are scarce, and particularly in the case of an ink jet method, manufacturing of a highly precise display is also possible so that this method can be the most promising method in the future.

In the mask vacuum vapor deposition method, when a light emitting material is selectively placed on a pixel portion, most of the material adheres to a mask, leading to remarkable decrease in material utilizing efficiency.

In contrast, the ink jet method is a method of the highest material utilizing efficiency since a light emitting material can be selectively placed only on necessary pixel portions.

The manufacturing method and manufacturing apparatus for realizing uniform thickness formation of a light emitting layer of an organic EL display by an ink jet method have been described above, and these descriptions are applied also to the method and apparatus for manufacturing a color filter by an ink jet method except that an organic EL material is changed to a dye material.

Figure 18:
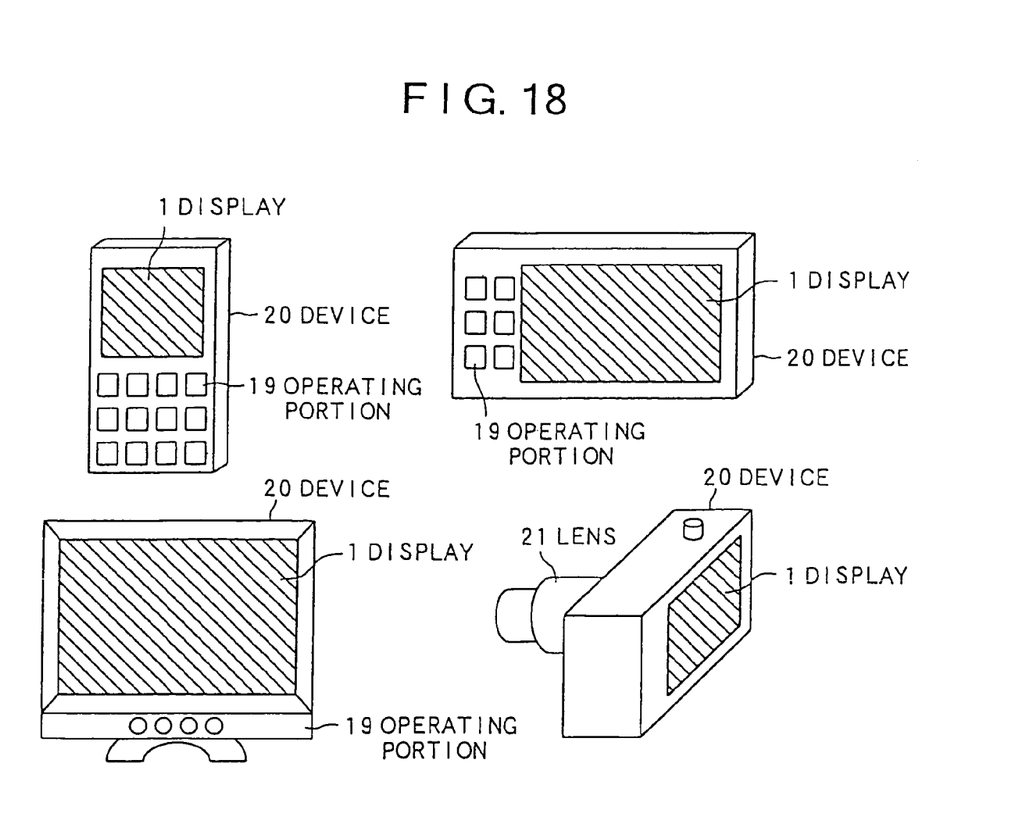
FIG. 18 is an example of an electronic device equipped with a display of the present invention.

As the organic EL display, organic EL display manufactured by using a color filter and device 20 as shown in FIG. 18 carrying LCD as a display 1, provided by using the present invention, a portable telephone provided with an operating portion 19 and a terminal of PDA (Personal Digital Assistant) type, PC (Personal Computer), TV receiver set, video camera, digital camera, and the like can be listed.

The present application has been illustrated above, and the present application will be illustrated further in detail based on examples.

The present application is not limited to them.

EXAMPLES

Example 1

The following solution was prepared as an example of the present invention.

Preparation of Organic EL Layer Forming Coating Solution

| | |
|---|---|
| Polyvinylcarbazole | 70 parts by weight |
| Oxadiazole compound | 30 parts by weight |
| Coumarin 6 (* fluorescent dye) | 1 part by weight |

These were dissolved in a proportion of 0.5 wt % in tetralin (solvent), to produce an organic EL material ink for ink jet.
* When the fluorescent dye is coumarin 6, green light emission having a peak at 501 nm, in the case of perylene, blue light emission having a peak at 460 to 470 nm, and in the case of DCM, red light emission having a peak at 570 nm was obtained, and these were used as light emitting materials of each color.

Ink Jet Apparatus

An ink jet apparatus provided with functions for discharging ink and continuously drying by heating over thereof as shown in FIG. 1 was fabricated. An IR heater was used for heating. The distance between a nozzle and a substrate, also, a distance between a heater and a substrate can be adjusted independently. For fixing a substrate, a vacuum adsorption mechanism was provided on a stage. For observing the condition of ink discharging and drying by heating, a CCD camera was provided. A head portion provided with a nozzle and heater is fixed, and mechanisms for X (longitudinal), Y (lateral), Z (up and down) and θ (rotation) and motors were provided so that a stage fixing a substrate can move in any directions. Alignment ability was provided for conducting precise alignment with a nozzle, utilizing an alignment mark on a substrate by CCD camera. A distance between a nozzle and substrate, a distance between a heater and substrate, the volume of one drop of an ink discharged from a nozzle, a number of discharging drops per unit time, a stage moving speed, discharging schedule of an ink from a nozzle and a heater temperature were set to be variable as parameters.

Manufacturing of Substrate

Using a polysilicon film, an active matrix substrate for organic EL having a pixel circuit constitution shown in FIG. 15 was manufactured on a glass substrate. On a substrate of 17 inch diagonal (size: 300 mm×370 mm), pixels of XGA (768×1024) standard were designed. A substrate on which electrodes and partitions are formed as shown in the sectional form in FIG. 11 was prepared. Partitions are placed so as to cover the electrode ends so that the partitions act also as electrode insulating layer. As the electrode, a transparent electrode such as ITO, NESA film, IZO and the like was formed into a film, and patterned by etching. As the partition, a photosensitive resist OFPR-800 (viscosity: 500 cp) manufactured by Tokyo Ohka Kogyo Co., Ltd. was spin coated at 1200 rpm and prebaked at 110° C., then, exposed by using a photomask, developed, and postbaked at 240° C. The partition was formed to have a height (film thickness) of 6 μm under the above mentioned conditions. The shape of thus formed partition can be confirmed easily by using a scanning type electron microscope (SEM) and the like. It was confirmed that the partition has a convex curved sectional shape to the substrate surface, and the sectional shape is a part of arc. A transparent electrode is used in an element structure of bottom emission, and a transparent substrate is used. It is also possible that a metal is used as an electrode to give a top emission element structure.

Manufacturing of Organic EL Display

After cleaning of a substrate, PEDOT/PSS (polythiophene: Bayer CH8000) with hole injecting property was coated by a thickness of 80 nm by spin coating, and baked at 160° C. to form a so-called buffer layer.

Using the above mentioned ink jet apparatus, the above mentioned organic EL material inks of R, G and B were continuously discharged to pixel openings on PEDOT and dried by heating, to form three color juxtaposition organic EL light emitting layers. To make the flattened film thickness after drying to be 100 nm, the parameter of the ink jet apparatus was adjusted, and the temperature of drying by heating was 100° C.

Subsequently, a MgAg alloy (Mg:Ag=10:1) was vapor-deposited to give a thickness of 150 nm, and on this, Ag was vapor-deposited to form a protective layer having a thickness of 200 nm, to obtain a cathode. When an active matrix display is manufactured by using a TFT substrate as in this case, a cathode is formed on the entire surface, and in the case of manufacturing of passive matrix display, a cathode is formed in the form of stripes so as to cross at right angles with an electrode pattern on a substrate.

Finally, the above was sealed by a separately prepared glass plate and a UV curing sealing material, to complete an organic LE display.

When a control circuit was connected to thus manufactured organic EL display and image signals were applied to drive the apparatus, poor emission derived from uneven thickness of an EL layer as shown in FIG. 12 did not occur, and uniform and bright color image display could be conducted on the entire surface.

Comparative Example

As a comparative example, the same procedure as in Example 1 was conducted except that the heater was off, to manufacture an organic EL display. When a control circuit was connected to this organic EL display and image signals were applied to drive the apparatus, poor light emitting pixels derived from uneven thickness of an EL layer as shown in FIG. 12 occurred in a large number, and uniform image display could not be conducted. Further, brightness under the same applied voltage decreased significantly, and its efficiency also lowered significantly.

Example 2

The same procedure as in Example 1 was conducted except that the ink jet apparatus of Example 1 was improved by providing heaters on the both sides of the nozzle as shown in FIG. 3, the movement of the stage was made into a combination of reciprocation and parallel movement as shown in FIG. 2, and ink discharge and drying by heating was carried out so that the heater at the backward of the nozzle, relatively to the stage reciprocation, is on.

When a control circuit was connected to thus manufactured organic EL display and image signals were applied to drive the apparatus, poor emission derived from uneven thickness of an EL layer as shown in FIG. 12 did not occur, and uniform and bright color image display could be conducted on the entire surface, as in Example 1.

In Example 1, drying by heating could be carried out when the stage is moving in only one direction. However, drying by heating can be carried out when the stage is moving in either direction of the reciprocation in Example 2. Therefore, through put was higher in Example 2, and productivity can be improved.

Example 3

The same procedure as in Example 1 was conducted except, as shown in FIG. 4, a stage was fixed, and mechanisms for X (longitudinal), Y (lateral), Z (up and down) and θ (rotation) and motors were provided so that a head portion could move in any directions, and an organic EL display capable of conducting uniform and bright color image display on the entire surface as in Example 1 could be manufactured.

Example 4

The same procedure as in Example 2 was conducted except, as shown in FIG. 5 and 6, a stage was fixed, and mechanisms for X (longitudinal), Y (lateral), Z (up and down) and θ (rotation) and motors were provided so that a head portion could move in any directions, and an organic EL display capable of conducting uniform and bright color image display on the entire surface as in Example 2 could be fabricated. In Example 3, drying by heating was not carried out in only one moving direction of the head, while in Example 4, drying by heating can be carried out in either direction of the head reciprocation. Therefore, throughput was higher in Example 4, and productivity can be improved.

Example 5

The same procedure as in Examples 1, 2, 3 and 4 was conducted except that also a buffer layer PEDOT/PSS was formed selectively on pixel openings by an ink jet method while forcibly drying by heating.

In the case of spin coating film formation in Examples 1, 2, 3 and 4 slight irregularity was observed after spin coating due to the influence of a partition surrounding the pixel. However, by forming by an ink jet method, film formation irregularity of PEDOT could be solved. By merely forming by an ink jet method, a problem of irregular thickness in pixels of PEDOT should newly occur, however, by the effect of drying by heating as in Examples 1, 2, 3 and 4 uniformity in the substrate surface could be improved while maintaining the same display ability and efficiency as in the case of spin coating.

Example 6

A color filter was manufactured by an ink jet method in the same manner as in Examples 1, 2, 3 and 4 except the organic EL material was changed to a pigment dye. Conventionally, a color filter manufactured by an ink jet method had a problem of irregular tone in pixels derived from irregular thickness of a dye layer as in FIG. 17. However,in this example, an excellent color filter could be manufactured without generating irregular tone.

Examples of the present invention have been described in the above. However, the present invention is not limited to the above.

What is claimed is:

1. A method for manufacturing an organic EL display by an ink jet method, wherein a uniform organic EL layer is formed by sequentially continuously carrying out processes of:

placing a substrate on a stage; discharge-placing at least an organic EL material in a form of solution on the substrate; and drying the organic EL material in a form of ink, immediately after being placed on the substrate, by heating over the organic EL material in a form of ink while controlling the temperature of the stage so the temperature of the stage does not rise by chilling the stage, and relatively moving an infrared heating device in X (longitudinal), Y (lateral), and Z (vertical) directions to the substrate, wherein the step of chilling the stage is accomplished by at least one of a chiller and a Peltier element.

2. The method for manufacturing an organic EL display according to claim 1 wherein the placing of the organic EL material on the substrate and drying by heating are sequentially continuously carried out by relatively moving the substrate to a nozzle which discharges the organic EL material and to a heating device which heats the organic EL material over thereof.

* * * * *